(12) United States Patent
Campbell et al.

(10) Patent No.: US 8,229,029 B2
(45) Date of Patent: Jul. 24, 2012

(54) TRANSMITTER WITH REDUCED SPECTRAL REGROWTH AND ASSOCIATED METHODS

(75) Inventors: Eric Campbell, Rochester, NY (US); Scott Zeller, Shortsville, NY (US); Bryce Tennant, Rochester, NY (US)

(73) Assignee: Harris Corporation, Melbourne, FL (US)

( * ) Notice: Subject to any disclaimer, the term of this patent is extended or adjusted under 35 U.S.C. 154(b) by 863 days.

(21) Appl. No.: 12/353,318

(22) Filed: Jan. 14, 2009

(65) Prior Publication Data

US 2010/0177848 A1 Jul. 15, 2010

(51) Int. Cl.
*H04K 1/20* (2006.01)
*H04L 25/03* (2006.01)
*H04L 25/49* (2006.01)

(52) U.S. Cl. ........ 375/297; 375/224; 375/279; 375/295; 375/308

(58) Field of Classification Search .................. 375/224, 375/279, 295, 297, 308
See application file for complete search history.

(56) References Cited

U.S. PATENT DOCUMENTS

| | | | | |
|---|---|---|---|---|
| 5,365,516 A * | 11/1994 | Jandrell | ......................... | 370/335 |
| 5,526,357 A * | 6/1996 | Jandrell | ......................... | 370/346 |
| 6,621,340 B1 | 9/2003 | Perthold et al. | ............... | 330/149 |
| 6,867,648 B2 | 3/2005 | Kim et al. | ........................ | 330/151 |
| 7,113,551 B2 | 9/2006 | Sills et al. | ...................... | 375/297 |
| 7,129,778 B2 | 10/2006 | Robinson | ....................... | 330/151 |
| 2004/0198414 A1* | 10/2004 | Hunton | ........................ | 455/550.1 |
| 2004/0263245 A1 | 12/2004 | Winter et al. | ................... | 330/10 |
| 2005/0141594 A1* | 6/2005 | Smith et al. | .................... | 375/130 |

FOREIGN PATENT DOCUMENTS

| | | |
|---|---|---|
| EP | 0360178 | 3/1990 |
| EP | 1119902 | 8/2003 |

* cited by examiner

*Primary Examiner* — Ted Wang
(74) *Attorney, Agent, or Firm* — Allen, Dyer, Doppelt, Milbrath & Gilchrist, P.A.

(57) ABSTRACT

A transmitter includes a monitoring circuit for monitoring phase transitions of in-phase and quadrature components of an input phase modulated signal. A filter is downstream from the monitoring circuit for generating a filtered phase modulated signal within an allocated bandwidth. A transmit gain controller is downstream from the filter for adjusting an amplitude of the filtered phase modulated signal based on a dynamic reference envelope control signal. A control circuit cooperates with the monitoring circuit and the transmit gain controller for generating the dynamic reference envelope control signal so that phase transitions are suppressed in the filtered phase modulated signal and so that the filtered phase modulated signal remains within the allocated bandwidth.

23 Claims, 5 Drawing Sheets

US 8,229,029 B2

TRANSMITTER WITH REDUCED SPECTRAL REGROWTH AND ASSOCIATED METHODS

FIELD OF THE INVENTION

The present invention relates to the field of communications devices, and more particularly, to a transmitter transmitting an output signal within an allocated channel and associated methods.

BACKGROUND OF THE INVENTION

Transmitters are typically designed to transmit output signal within allocated channels. A transmitted output signal extending beyond its allocated channel may cause interference with an adjacent channel. This is known as adjacent channel emission.

For a phase modulated (PM) transmitter, for example, rapid phase transitions of a phase modulated waveform can create a wide bandwidth signal that is then forced through low-pass analog filters to provide rejection of the sampling artifacts. The low-pass filter bandwidth is much narrower than the bandwidth of the original signal. This may result in a substantial amplitude component on the filtered phase modulated signal.

The filtered phase modulated signal is then typically applied to a transmit gain controller. The transmit gain controller operates based on a transmit gain control (TGC) loop that applies a fixed DC value as a reference envelope control signal to reduce envelope variations in the filtered phase modulated signal. However, the TGC loop has a wider bandwidth than the filter bandwidth allowing the high frequency components to be re-introduced. This leads to high frequency components being introduced while "flattening" the envelope of the filtered phase modulated signal during phase transitions.

The remaining amplitude components and introduction of high frequency components result in extra energy in the adjacent channels, i.e., adjacent channel emission. In other words, the TGC loop is creating spectral regrowth by introducing the high frequency components while attempting to "flatten" the output transmit signal during phase transitions.

One approach for reducing spectral regrowth is to modify the transmitter by adding a filter to the output of the TGC loop. While effective in terms of performance, this approach may not be cost effective for existing transmitters already fielded since hardware modifications are needed.

Yet another approach for reducing spectral regrowth is disclosed in U.S. Patent Application No. 2004/0017859, A transmitter includes a pre-distorter to improve linearity of a power amplifier providing an amplified transmission signal. The amplified transmission signal is conditioned into a narrowband feedback signal that is responsive to a logarithm of the power appearing in the out-of-band components of the amplified transmission signal. The feedback signal is processed in a pre-distortion processor that implements an algorithm to adapt pre-distortion functions implemented in the pre-distorter, which is to improve linearity over time. The algorithm tests a population of randomly-generated pre-distortion functions. A baseline component of the coefficients from pre-distortion functions used in a subsequent population tracks the best-fit pre-distortion function from the current population. New populations are generated from old populations. While this approach is effective in terms of performance, it also is not cost effective for existing transmitters already fielded since hardware modifications are needed.

SUMMARY OF THE INVENTION

In view of the foregoing background, it is therefore an object of the present invention to provide a cost effective approach for reducing spectral regrowth in a transmitter.

This and other objects, features, and advantages in accordance with the present invention are provided by a transmitter comprising a monitoring circuit for monitoring phase transitions in in-phase and quadrature components of an input phase modulated signal, a filter downstream from the monitoring circuit for generating a filtered phase modulated signal within an allocated bandwidth, and a transmit gain controller downstream from the filter for adjusting an amplitude of the filtered phase modulated signal based on a dynamic reference envelope control signal. A control circuit may cooperate with the monitoring circuit and the transmit gain controller for generating the dynamic reference envelope control signal so that phase transitions are suppressed in the filtered phase modulated signal and so that the filtered phase modulated signal remains within the allocated bandwidth.

The transmit gain controller is advantageously used to adjust the amplitude of the filtered phase modulated signal based on the dynamic reference envelope control signal. Instead of a fixed value reference envelope control signal, as is typical in the prior art, the dynamic reference envelope control signal may vary between a nominal value and a suppressed value. The suppressed value may be applied to the phase transitions of the filtered phase modulated signal to reduce spectral regrowth.

By reducing spectral regrowth, this advantageously allows the filtered phase modulated signal that is to be transmitted to remain within an allocated bandwidth, which helps to avoid interference with an adjacent channel. In addition, since the dynamic reference envelope control signal may be changed via software, a cost effective approach is provided since hardware modifications to existing transmitters may be avoided.

The transmit gain controller may adjust the amplitude of the filtered phase modulated signal to correspond with an amplitude of the dynamic reference envelope control signal. The transmit gain controller may adjust the amplitude of the dynamic reference envelope control signal to vary between the nominal value and the suppressed value, with the suppressed value corresponding to the phase transitions of the filtered phase modulated signal.

The control circuit may adjust the dynamic reference envelope control signal according to a profile based on a modulation type and data rate of the filtered phase modulated signal. The profile of the dynamic reference envelope control signal may comprise at least one of nominal and suppressed amplitude values, a duration of the suppressed amplitude value, and a delay corresponding to application of the suppressed amplitude value by the transmit gain controller after detection of a phase transition by the monitoring circuit. The profile may be programmable.

The transmitter may comprise a digital signal processor (DSP) for generating the input phase modulated signal having the in-phase and quadrature components. The monitoring circuit and the control circuit may be configured as part of a field programmable gate array (FPGA).

Another aspect is directed to a method for suppressing a filtered phase modulated signal to be transmitted. The method may comprise monitoring phase transitions of in-phase and quadrature components of an input phase modulated signal with a monitoring circuit, and generating a filtered phase modulated signal within an allocated bandwidth with a filter downstream from the monitoring circuit. An amplitude of the filtered phase modulated signal may be adjusted based on a dynamic reference envelope control signal with a transmit gain controller downstream from the filter. The method may further comprise generating the dynamic reference envelope control signal using a control circuit cooperating with the monitoring circuit and the transmit gain controller so that the phase transitions are suppressed in the filtered phase modulated signal and so that the filtered phase modulated signal remains within the allocated bandwidth.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
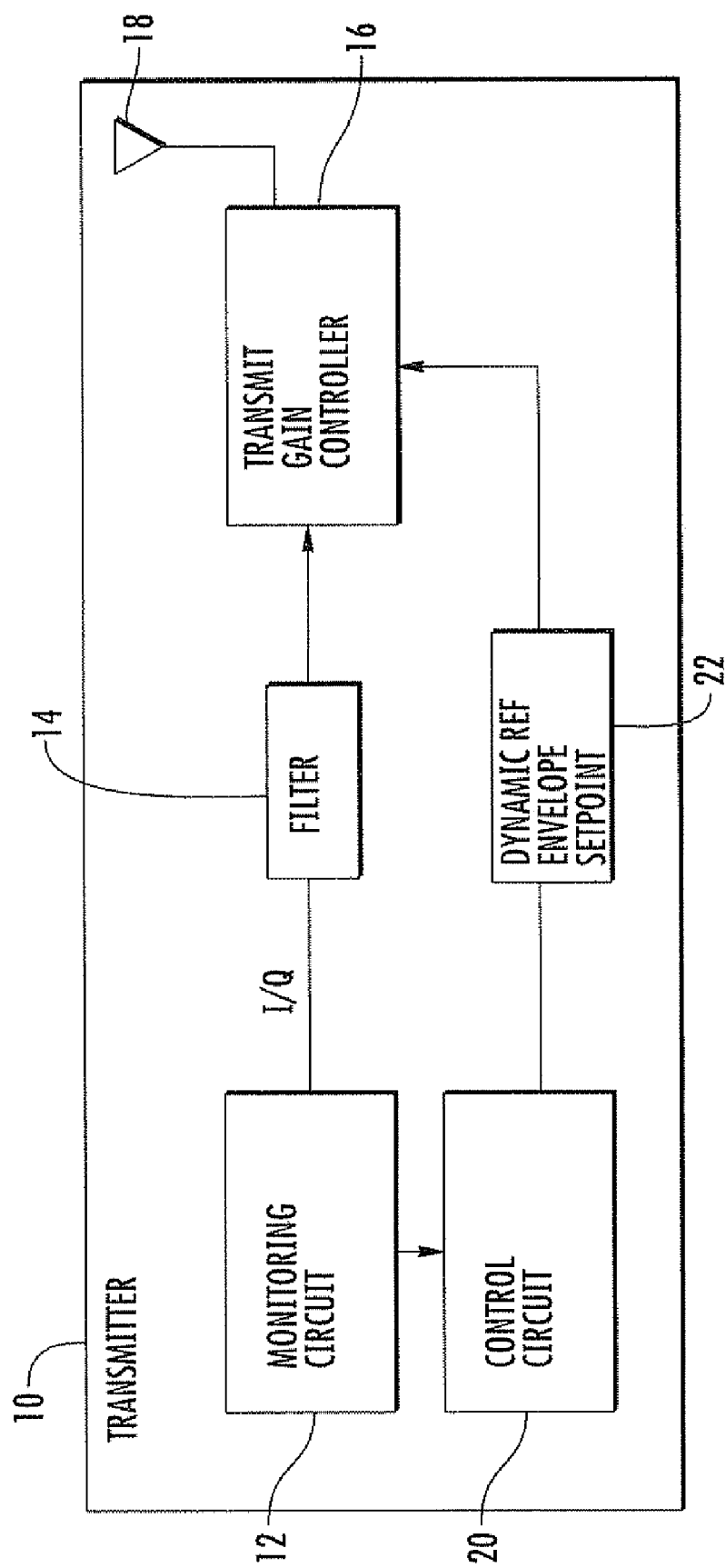
FIG. 1 is a block diagram of a transmitter including a transmit gain controller operating with a dynamic reference envelope control signal in accordance with the present invention.

Referring initially to FIG. 1, a transmitter 10 comprises a monitoring circuit 12 for monitoring phase transitions of in-phase (I) and quadrature (Q) components of an input phase modulated signal, and a filter 14 is downstream from the monitoring circuit 12 for generating a filtered phase modulated signal within an allocated bandwidth. A transmit gain controller 16 is downstream from the filter for adjusting an amplitude of the filtered phase modulated signal based on a dynamic reference envelope control signal prior to transmission via antenna 18.

A control circuit 20 cooperates with the monitoring circuit 12 and the transmit gain controller 16 for generating the dynamic reference envelope control signal so that phase transitions are suppressed in the filtered phase modulated signal and so that the filtered phase modulated signal remains within the allocated bandwidth. The transmit gain controller 16 manages the amplitude of the transmit signal in an effort to achieve a constant envelope by integrating against a dynamic reference envelope setpoint 22 as provided by the control circuit 20.

As will be explained in greater detail below, the transmit gain controller 16 is advantageously used to adjust the amplitude of the filtered phase modulated signal based on the dynamic reference envelope control signal. Instead of a fixed value reference envelope control signal, the dynamic reference envelope control signal is adjusted by the control circuit 20 so that it varies between a nominal value and a suppressed value. The suppressed value is to be applied to the phase transitions of the filtered phase modulated signal to reduce spectral regrowth.

Figure 2:
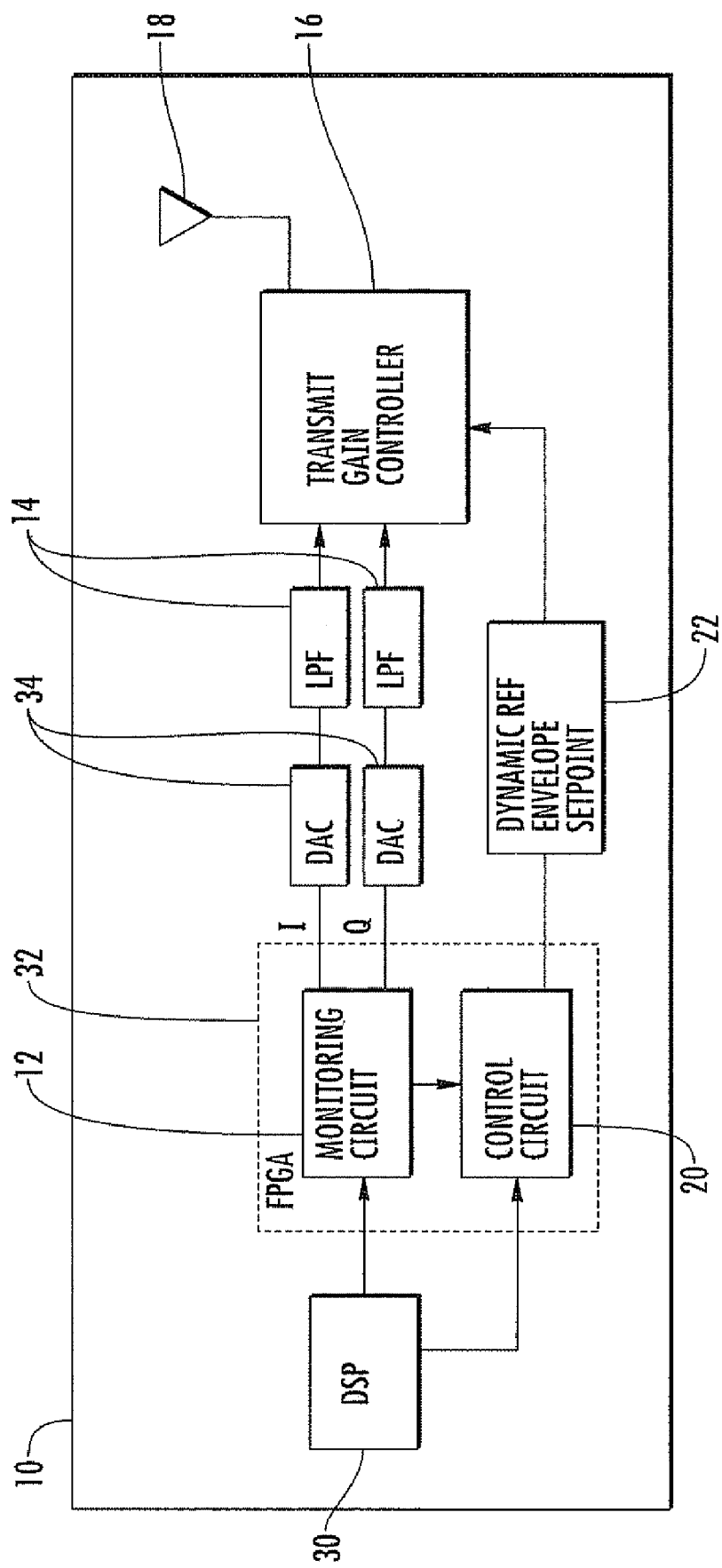
FIG. 2 is a more detailed block diagram of the transmitter illustrated in FIG. 1.

The input phase modulated signals having the in-phase and quadrature components may be provided by a digital signal processor (DSP) 30, as illustrated in FIG. 2. Still referring to FIG. 2, the monitoring circuit 12 and the control circuit 20 may be configured as part of a field programmable gate array (FPGA). The in-phase and quadrature components generated by the monitoring circuit 12 are serially provided to a pair of digital-to-analog converters (DAC) 34. The analog in-phase and quadrature components from the digital-to-analog converters 34 are then passed through respective analog low-pass filters 14 to remove sampling artifacts.

The transmit gain controller 16 mixes the filtered analog in-phase and quadrature components, i.e., the filtered phase modulated signal, to generate the output transmit signal. In doing so, the transmit gain controller 16 adjusts the amplitude of the filtered phase modulated signal to correspond with an amplitude of the dynamic reference envelope control signal.

The control circuit 20 may adjust the dynamic reference envelope control signal according to a profile based on a modulation type and data rate of the filtered phase modulated signal. The profile is initially stored in the DSP 30, and is loaded into the control circuit 20 during each transmit session.

More particularly, the profile of the dynamic reference envelope control signal includes the following: nominal and suppressed amplitude values, a duration of the suppressed amplitude valuer and a delay corresponding to application of the suppressed amplitude value by the transmit gain controller 16 after detection of a phase transition by the monitoring circuit 12.

Figure 3:
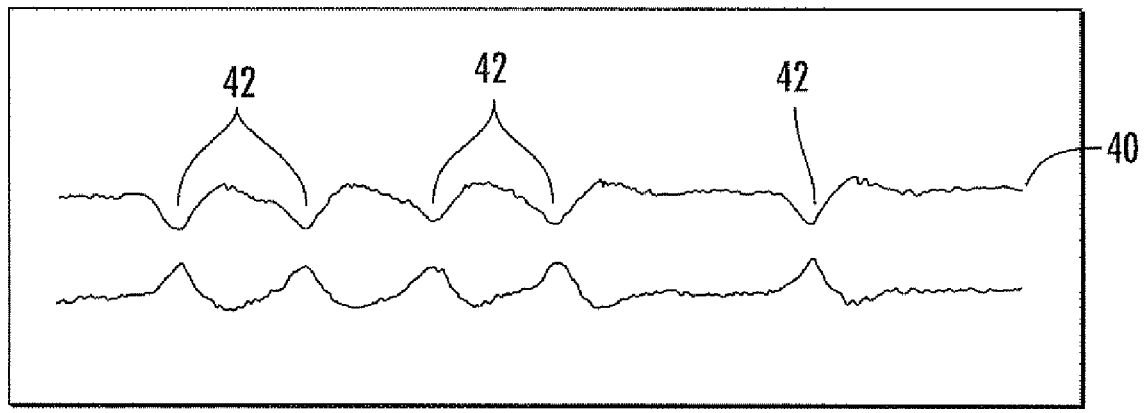
FIG. 3 is a time domain plot of a filtered phase modulated signal prior to application of the dynamic reference envelope control signal in accordance with the present invention.
Figure 4:
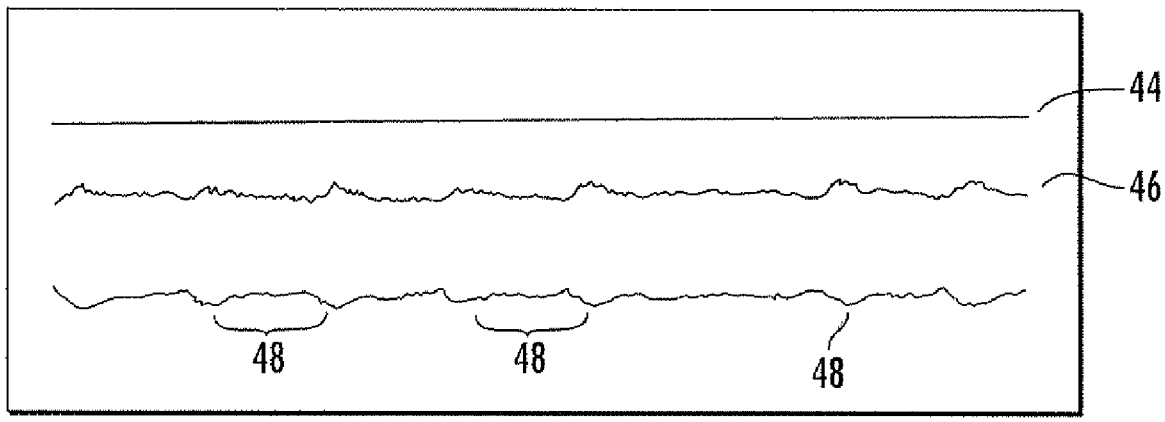
FIG. 4 is a time domain plot of a reference envelope control signal and a transmit output signal after application of the reference envelope control signal to a filtered phase modulated signal in accordance with the prior art.
Figure 5:
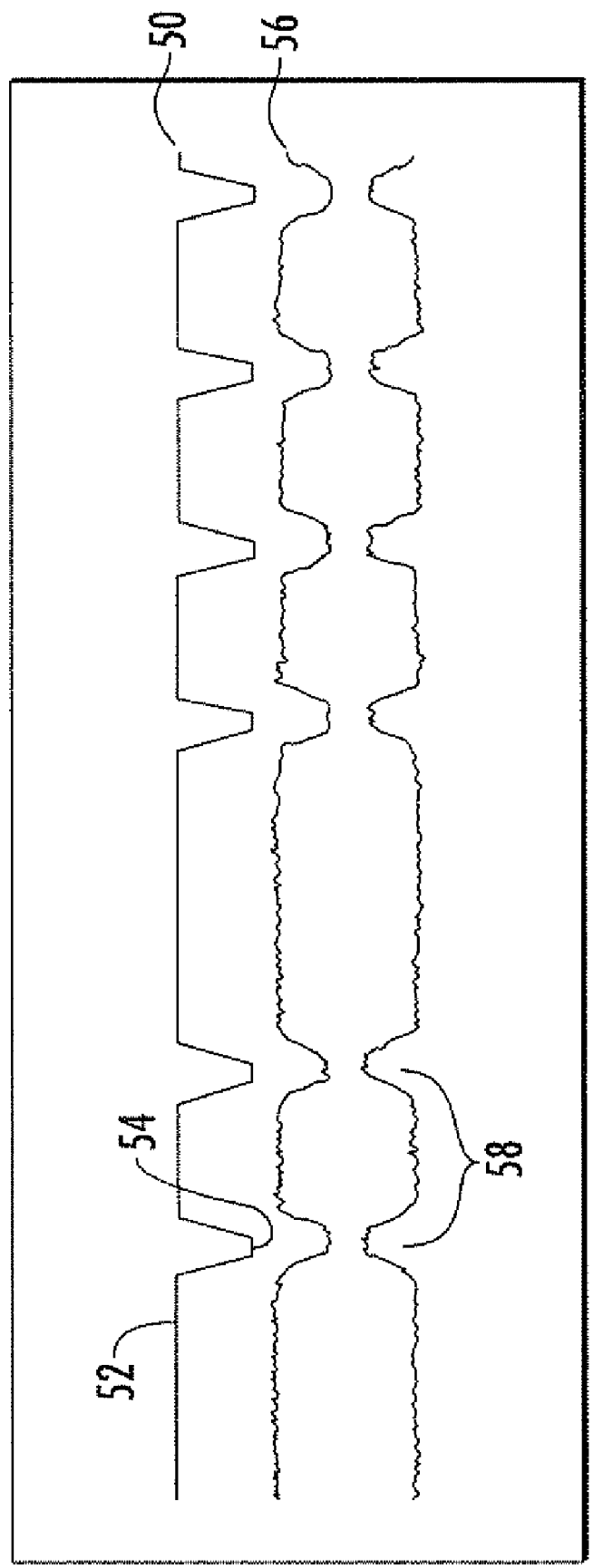
FIG. 5 is a time domain plot of a dynamic reference envelope control signal and a transmit output signal after application of the dynamic reference envelope control signal to a filtered phase modulated signal in accordance with the present invention.

Referring now to FIGS. 3-5, various time domain plots will be discussed to better illustrate the advantages of the transmit gain controller 16 applying a dynamic reference envelope control signal to a filtered phase modulated signal 40. The filtered phase modulated signal 40 has not yet been driven to a constant amplitude by the transmit gain controller 16. The phase transitions 42 in the filtered phase modulated signal 40 are where the spectral regrowth occurs when the transmit gain controller 16 applies a fixed reference envelope control signal 44 having a fixed DC value, as illustrated in FIG. 4.

Still referring to FIG. 4, after the transmit gain controller 16 applies the fixed reference envelope control signal 44 to the filtered phase modulated signal 40, the resulting output transmit signal 46 includes spectral regrowth 48. Since the lowpass filter bandwidth 14 is much narrower than the bandwidth of the signal prior to being filtered, there is a substantial amplitude component on the output transmit signal 46. Spectral regrowth 48 in the form of high frequency components are introduced while "flattening" the output transmit signal 46 during phase transitions 42. The remaining amplitude components and introduction of high frequency components result in extra energy in the adjacent channels.

For illustration purposes, the transmitter 10 operates in the UHF band, with 25 kHz channel spacings. However, the transmitter 10 is not limited to this band, and may operate at other frequency bands, as readily appreciated by those skilled in the art.

Referring now to FIG. 5, the transmit gain controller 16 operates with a dynamic reference envelope control signal 50. The amplitude of the dynamic reference envelope control signal 50 varies between a nominal value 52 and a suppressed value 54, with the suppressed value corresponding to the phase transitions 42 of the filtered phase modulated signal 40. The resulting output transmit signal is indicated by reference 56. The suppressed value 54 of the dynamic reference control envelope 50 reduces spectral regrowth that would typically be added by the transmit gain controller 16 when using a fixed value reference envelope control signal 44. In the phase transitions 58 of the output transmit signal 56, the transmit gain controller 16 advantageously reduces unwanted spectral content rather than stabilize power during the phase transitions.

As noted above, the control circuit 20 adjusts the dynamic reference envelope control signal 50 according to a profile based on a modulation type and data rate of the filtered phase modulated signal 40. The modulation type may be binary phase shift keying (BPSK) or differential phase shift keying (DPSK), for example. Other modulation types may be used as long as the phase modulated signal has a constant envelope, as readily appreciated by those skilled in the art. In addition, the modulation type may also be quadrature amplitude modulation (QAM), as readily appreciated by those skilled in the art. The profile of the dynamic reference envelope control signal 50 can be manually configured for each modulation type and data rate to achieve the best results.

The profile includes a nominal value corresponding to a desired transmit gain control reference value, and a suppressed value corresponding to a transmit gain control reference value applied during phase/symbol transitions. The profile includes a delay which corresponds to an offset between when a phase/symbol transition is detected and when the transmit gain control profile is to be applied. The delay takes into account the time it takes for the filtered phase modulated signal 40 to travel from the monitoring circuit 12 to the transmit gain controller 16.

The profile can be manually adjusted to modify or balance performance based on specification requirements of the transmitter 10. This also allows new phase modulated waveform types to be added to fielded radios without changing hardware while meeting strict adjacent channel emission requirements.

By reducing spectral regrowth in the output transmit signal 56, this advantageously allows the filtered phase modulated signal 40 to remain within its allocated bandwidth, which helps to avoid or reduce interference with an adjacent channel. In addition, since the dynamic reference envelope control signal 50 is changed via software, a cost effective approach is provided since hardware modifications to existing transmitters are avoided.

Figure 6:
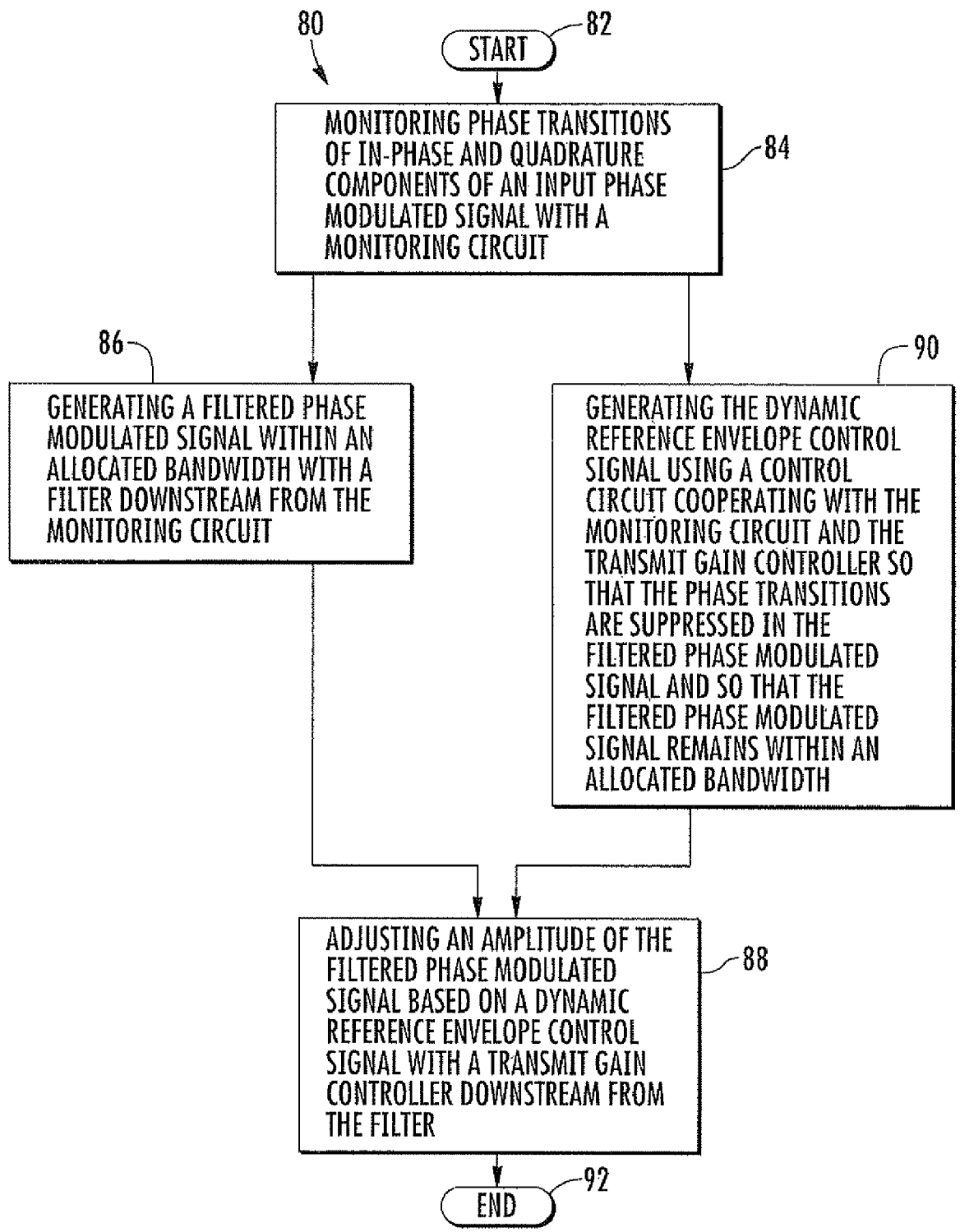
FIG. 6 is a flow chart illustrating a method for suppressing a filtered phase modulated signal in accordance with the present invention.

Referring now to FIG. 6, a flow chart 80 illustrating a method for suppressing a filtered phase modulated signal 40 to be transmitted so that the filtered phase modulated signal remains within an allocated bandwidth will be discussed. From the start (Block 82), the method comprises monitoring phase transitions of in-phase and quadrature components of an input phase modulated signal with a monitoring circuit 12 at Block 84. A filtered phase modulated signal 40 is generated within an allocated bandwidth at Block 86 with a filter 14 downstream from the monitoring circuit 12. An amplitude of the filtered phase modulated signal 40 is adjusted at Block 88 based on a dynamic reference envelope control signal 50 with a transmit gain controller 16 downstream from the filter 14. The dynamic reference envelope control signal 50 is generated at Block 90 using a control circuit 20 cooperating with the monitoring circuit 12 and the transmit gain controller 16 so that the phase transitions are suppressed in the filtered phase modulated signal 40 and so that the filtered phase modulated signal 40 remains within the allocated bandwidth. The method ends at Block 92.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A transmitter comprising:
   a monitoring circuit for monitoring phase transitions of in-phase and quadrature components of an input phase modulated signal;
   a filter downstream from said monitoring circuit for generating a filtered phase modulated signal within an allocated bandwidth;
   a transmit gain controller downstream from said filter for adjusting an amplitude of the filtered phase modulated signal based on a dynamic reference envelope control signal; and
   a control circuit cooperating with said monitoring circuit and said transmit gain controller for generating the dynamic reference envelope control signal so that phase transitions are suppressed in the filtered phase modulated signal and so that the filtered phase modulated signal remains within the allocated bandwidth.

2. The transmitter according to claim 1 wherein said transmit gain controller adjusts the amplitude of the filtered phase modulated signal to correspond with an amplitude of the dynamic reference envelope control signal.

3. The transmitter according to claim 1 wherein said transmit gain controller adjusts an amplitude of the dynamic reference envelope control signal to vary between a nominal value and a suppressed value, with the suppressed value corresponding to the phase transitions of the filtered phase modulated signal.

4. The transmitter according to claim 1 wherein said control circuit adjusts the dynamic reference envelope control signal according to a profile based on a modulation type and data rate of the filtered phase modulated signal.

5. The transmitter according to claim 4 wherein the profile of the dynamic reference envelope control signal comprises at least one of nominal and suppressed amplitude values, a duration of the suppressed amplitude value, and a delay corresponding to generation of the suppressed amplitude value by said transmit gain controller after detection of a phase transition by said monitoring circuit.

6. The transmitter according to claim 4 wherein the profile of the dynamic reference envelope control signal is programmable.

7. The transmitter according to claim 1 further comprising a digital signal processor (DSP) for generating the input phase modulated signal having the in-phase and quadrature components.

8. The transmitter according to claim 1 wherein said monitoring circuit and said control circuit are configured as part of a field programmable gate array (FPGA).

9. A transmitter comprising:
   a monitoring circuit for monitoring phase transitions of in-phase and quadrature components of an input phase modulated signal;

a filter downstream from said monitoring circuit for generating a filtered phase modulated signal within an allocated bandwidth;

a transmit gain controller downstream from said filter for adjusting an amplitude of the filtered phase modulated signal to correspond with an amplitude of a dynamic reference envelope control signal, with the amplitude being adjusted to vary between a nominal value and a suppressed value, with the suppressed value corresponding to the phase transitions of the filtered phase modulated signal; and a control circuit cooperating with said monitoring circuit and said transmit gain controller for generating the dynamic reference envelope control signal with the nominal value or the suppressed value so that phase transitions are suppressed in the filtered phase modulated signal and so that the filtered phase modulated signal remains within the allocated bandwidth.

10. The transmitter according to claim 9 wherein said transmit gain controller adjusts an amplitude of the dynamic reference envelope control signal to vary between a nominal value and a suppressed value, with the suppressed value corresponding to the phase transitions of the filtered phase modulated signal.

11. The transmitter according to claim 9 wherein said control circuit adjusts the dynamic reference envelope control signal according to a profile based on a modulation type and data rate of the filtered phase modulated signal.

12. The transmitter according to claim 11 wherein the profile of the dynamic reference envelope control signal comprises at least one of nominal and suppressed amplitude values, a duration of the suppressed amplitude value, and a delay corresponding to generation of the suppressed amplitude value by said transmit gain controller after detection of a phase transition by said monitoring circuit.

13. The transmitter according to claim 12 wherein the profile of the dynamic reference envelope control signal is programmable.

14. The transmitter according to claim 9 further comprising a digital signal processor (DSP) for generating the input phase modulated signal having the in-phase and quadrature components.

15. The transmitter according to claim 9 wherein said monitoring circuit and said control circuit are configured as part of a field programmable gate array (FPGA).

16. A method for suppressing a filtered phase modulated signal to be transmitted, the method comprising:

monitoring phase transitions of in-phase and quadrature components of an input phase modulated signal with a monitoring circuit;

generating a filtered phase modulated signal within an allocated bandwidth with a filter downstream from the monitoring circuit;

adjusting an amplitude of the filtered phase modulated signal based on a dynamic reference envelope control signal with a transmit gain controller downstream from the filter; and generating the dynamic reference envelope control signal using a control circuit cooperating with the monitoring circuit and the transmit gain controller so that the phase transitions are suppressed in the filtered phase modulated signal and so that the filtered phase modulated signal remains within an allocated bandwidth.

17. The method according to claim 16 wherein the transmit gain controller adjusts the amplitude of the filtered phase modulated signal to correspond with an amplitude of the dynamic reference envelope control signal.

18. The method according to claim 16 wherein the transmit gain controller adjusts an amplitude of the dynamic reference envelope control signal to vary between a nominal value and a suppressed value, with the suppressed value corresponding to the phase transitions of the filtered phase modulated signal.

19. The method according to claim 16 wherein the control circuit adjusts the dynamic reference envelope control signal according to a profile based on a modulation type and data rate of the filtered phase modulated signal.

20. The method according to claim 19 wherein the profile of the dynamic reference envelope control signal comprises at least one of nominal and suppressed amplitude values, a duration of the suppressed amplitude value, and a delay corresponding to generation of the suppressed amplitude value by the transmit gain controller after detection of a phase transition by the monitoring circuit.

21. The method according to claim 19 wherein the profile of the dynamic reference envelope control signal is programmable.

22. The method according to claim 16 further comprising generating the input phase modulated signal having the in-phase and quadrature components using a digital signal processor (DSP) coupled to the monitoring circuit.

23. The method according to claim 16 wherein the monitoring circuit and the control circuit are configured as part of a field programmable gate array (FPSA).

* * * * *